(12) United States Patent
Mishima

(10) Patent No.: US 7,142,284 B2
(45) Date of Patent: Nov. 28, 2006

(54) POSITION DETECTOR, POSITION DETECTING METHOD, AND EXPOSURE APPARATUS HAVING THE SAME

(75) Inventor: Kazuhiko Mishima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 10/998,596

(22) Filed: Nov. 30, 2004

(65) Prior Publication Data

US 2005/0117140 A1    Jun. 2, 2005

(30) Foreign Application Priority Data

Dec. 1, 2003    (JP) ............................. 2003-401216

(51) Int. Cl.
*G03B 27/42* (2006.01)
*G03B 27/52* (2006.01)

(52) U.S. Cl. .......................................... 355/53; 355/55

(58) Field of Classification Search .................. 355/52, 355/53, 55, 67, 69; 250/548; 356/399–401
See application file for complete search history.

(56) References Cited

U.S. PATENT DOCUMENTS

| | | | | |
|---|---|---|---|---|
| 5,936,253 | A * | 8/1999 | Sugaya | 250/548 |
| 5,943,135 | A | 8/1999 | Mishima | 356/401 |
| 6,151,121 | A | 11/2000 | Mishima | 356/399 |
| 6,219,130 | B1 * | 4/2001 | Kawakubo | 355/67 |
| 6,335,784 | B1 | 1/2002 | Mishima | 355/53 |
| 6,539,326 | B1 * | 3/2003 | Hirano | 702/150 |
| 6,707,533 | B1 | 3/2004 | Mishima | 355/53 |
| 6,870,632 | B1 | 3/2005 | Tanaka et al. | 356/401 |
| 6,906,805 | B1 * | 6/2005 | Ina et al. | 356/497 |
| 6,992,780 | B1 * | 1/2006 | Sentoku et al. | 356/620 |
| 2002/0175300 | A1 | 11/2002 | Suzuki et al. | 250/548 |
| 2002/0176096 | A1 | 11/2002 | Sentoku et al. | 356/620 |
| 2003/0053057 | A1 | 3/2003 | Mishima | 356/401 |
| 2003/0053059 | A1 | 3/2003 | Mishima et al. | 356/401 |

FOREIGN PATENT DOCUMENTS

JP    2002-353099    12/2002

* cited by examiner

*Primary Examiner*—Henry Hung Nguyen
(74) *Attorney, Agent, or Firm*—Fitzpatrick, Cella, Harper & Scinto

(57) ABSTRACT

A position detector for detecting a relative positional relationship between an original form that has a position detecting mark, and a stage that supports the original form and has a reference mark. The position detector includes an illumination optical system for illuminating the position detecting mark or the reference mark using illumination light, a detection optical system for introducing reflection light that is reflected from the position detecting mark or the reference mark, to an image pickup unit, and a controller for varying at least one of a numerical aperture of the detection optical system, a numerical aperture of the illumination optical system and a wavelength of the illumination light to control contrast of a mark signal that is detected by the image pickup unit and indicates the position detecting mark or the reference mark. The relative positional relationship is detected using offsets generated in a predetermined numerical aperture of the detection optical system, a predetermined numerical aperture of the illumination optical system and a predetermined wavelength of the illumination light measured beforehand.

9 Claims, 14 Drawing Sheets

POSITION DETECTOR, POSITION DETECTING METHOD, AND EXPOSURE APPARATUS HAVING THE SAME

BACKGROUND OF THE INVENTION

The present invention relates generally to a position detector, and, more particularly, to a position detector that detects a position of an object, such as a reticle, with high precision in an exposure apparatus used to expose various devices, such as a semiconductor chip, e.g., an IC and an LSI, a liquid crystal display, and a thin film magnetic head. The present invention is suitable for an exposure apparatus that utilizes extreme ultraviolet ("EUV") light as an exposure light source.

A reduction projection exposure apparatus has been conventionally employed, which uses a projection optical system to project a circuit pattern on a mask (or a reticle) onto a wafer, etc., to transfer the circuit pattern, in manufacturing a fine semiconductor device, such as a semiconductor memory and a logic circuit in the photolithography technology.

The transferable minimum critical dimension (or the resolution) of the projection exposure apparatus is proportionate to a wavelength of the exposure light, and inversely proportional to the numerical aperture ("NA") of the projection optical system. The shorter the wavelength is, the better the resolution is. Along with recent demands for finer semiconductor devices, a shorter wavelength of ultraviolet light has been promoted in the exposure light source from an ultra-high pressure mercury lamp (i-line with a wavelength of approximately 365 nm) to a KrF excimer laser (with a wavelength of approximately 248 nm) and an ArF excimer laser (with a wavelength of approximately 193 nm).

However, lithography using ultraviolet ("UV") light has a limit to satisfy the rapidly promoting fine processing of a semiconductor device, and a projection optical system that uses the EUV light with a wavelength of 10 to 15 nm shorter than that of the ultraviolet, which is referred to as an "EUV exposure apparatus" hereinafter, has been developed to efficiently transfer a very fine circuit pattern of 0.1 μm or less.

As the light absorption in a material remarkably increases in a wave range of the EUV light, it is impractical to use a refractive element, which is applicable to the visible and UV lights. In other words, there are no glass materials usable for the wave range of the EUV light. Accordingly, a reflective element or a mirror, e.g., a multilayer coating mirror, is used for the EUV exposure apparatus. In addition, a reflection reticle is used, which makes a pattern to be transferred, of an absorber on a mirror.

On the other hand, the improved resolution also demands highly precise alignments between the stage and the reticle, between the wafer and the stage, and between a reticle and a wafer in the projection exposure apparatus. The projection exposure apparatus includes a position detector for detecting an alignment mark formed on the reticle, etc., which is so-called an alignment optical system or an alignment scope.

For example, a reticle alignment between a reticle reference mark that has been precisely positioned relative to the apparatus body and an alignment mark on the reticle includes the steps of illuminating the reticle reference mark and the alignment mark using the alignment light that has a different wavelength from that of the exposure light, forming images of the lights that transmit the marks on an image pickup device, detecting a positional offset between the reticle and the apparatus body based on the positional relationship of the images of both marks, and conducting an alignment between the reticle and the apparatus body. See, for example, Japanese Patent Application, Publication No. 2002-353099.

However, the reticle alignment in the EUV exposure apparatus uses the reflection reticle and, thus, cannot detect the images of both marks, because the alignment light does not transmit through the reticle reference mark and the alignment mark.

In addition, the reflection reticle and the multilayer coating mirror are optimized so that they exhibit high reflectance to the EUV light's wavelength and do not exhibit sufficient reflectance to the alignment light as the non-exposure light. For example, in the through-the-lens ("TTL") alignment that detects the alignment mark on the reflection reticle via the projection optical system using the non-exposure light, the alignment mark's reflectance is so low for the alignment light that the detected mark signal may have a lowered contrast.

Although it is conceivable to detect the alignment mark on the reflection reticle without intervening the projection optical system, using a particular wavelength of the non-exposure light might cause the mark signal to be undetectable due to a lack of contrast, since the pattern on the reflection reticle has guaranteed reflectance and an absorption factor to the exposure light, as discussed above. A mark signal with a low contrast does not meet a requirement of the highly precise position detection or ultimately makes the alignment mark itself undetectable.

There is a demand for a position detector and a position detecting method suitable for highly precise detections of a position for a reflective optical element.

BRIEF SUMMARY OF THE INVENTION

A position detector according to one aspect of the present invention for detecting a relative positional relationship between a reflection original form that has a position detecting mark, and a stage that supports the reflection original form and has a reference mark, the position detector includes an illumination optical system for illuminating the position detecting mark or the reference mark using illumination light, a detection optical system for introducing reflection light that is reflected from the position detecting mark or the reference mark, to an image pickup unit, and a controller for controlling contrast of a mark signal that is detected by the image pickup unit and indicates the position detecting mark or the reference mark.

A position detecting method for detecting a relative positional relationship between a reflection original form that has a position detecting mark, and a stage that supports the reflection original form and has a reference mark, includes the steps of detecting reflection light that is reflected from the position detecting mark or the reference mark under a predetermined detecting condition, determining whether the mark signal obtained from the reflection light detected in the detecting step has a predetermined contrast, and changing the detecting condition when the determining step determines that the mark signal does not have the predetermined contrast.

A position detecting method, for detecting a relative positional relationship between a reflection original form that has a position detecting mark, and a stage that supports the reflection original form and has a reference mark, includes previously storing, for each coating thickness and reflectance of the position detecting mark or the reference mark, a detecting condition, under which reflection light that is reflected from the position detecting mark or the reference mark being detected, obtaining a coating thickness and reflectance of the position detecting mark or the reference mark, and selecting the detecting condition based on the coating thickness and reflectance of the position detecting mark or the reference mark obtained in the obtaining step.

An exposure method, for illuminating a pattern on a reflection original form using exposure light, and for exposing a pattern onto an object through a projection optical system, includes the steps of conducting an alignment for the reflection original form using the above position detecting method, and irradiating the exposure light onto the reflection original form that has been aligned.

A device manufacturing method includes the steps of exposing an object using the above exposure apparatus, and developing the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
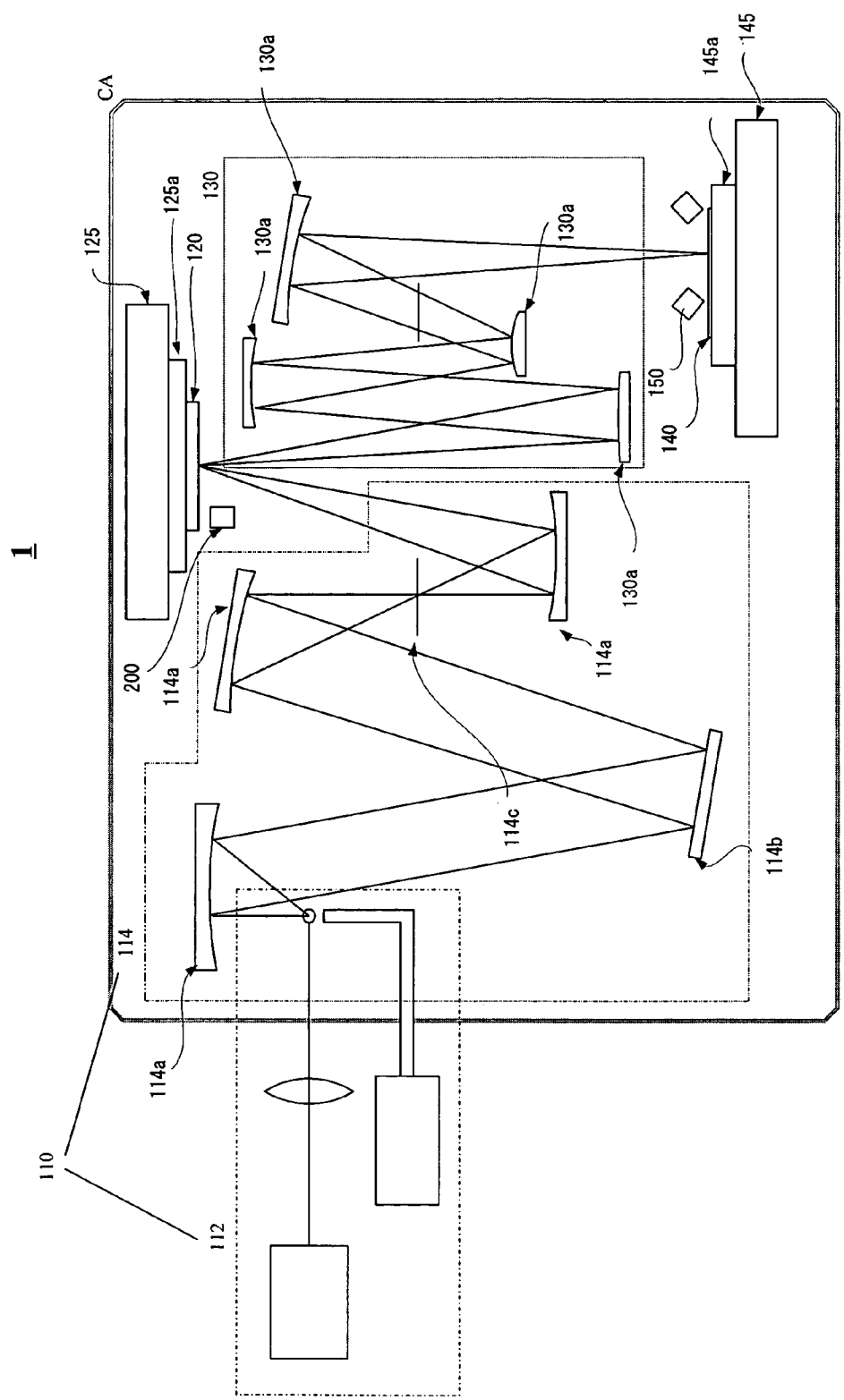
FIG. 1 is a schematic block diagram showing a structure of an exposure apparatus according to one aspect of the present invention.

A description will now be given of preferred embodiments of the present invention with reference to the accompanying drawings. The same reference numerals in each figure denotes the same elements, and a duplicate description thereof will be omitted. FIG. 1 is a schematic block diagram showing a structure of the exposure apparatus 1 according to one aspect of the present invention.

The exposure apparatus 1 uses EUV light (with a wavelength of, e.g., 13.4 nm) as illumination light for exposure, and exposes onto an object 140 a circuit pattern created on a reticle 120, for example, in a step-and-scan manner or a step-and-repeat manner. This exposure apparatus is suitable for a lithography process less than a submicron or a quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot for every shot of cell projection into the wafer.

Referring to FIG. 1, the exposure apparatus 1 includes an illumination optical system 110, a reticle stage 125 for supporting the reticle 120, a projection optical system 130, a wafer stage 145 for supporting the object 140, a focus position detecting mechanism 150, and a position detector 200.

As shown in FIG. 1, at least the optical path through which the EUV light travels, or the entire optical system, should preferably be maintained in a vacuum atmosphere by a vacuum chamber CA, since the EUV light has a low transmittance to the air and causes contaminations in reaction with residue gas components, such as a polymer organic gas.

The illumination apparatus 110 uses the arc-shaped EUV light (with a wavelength of, for example, 13.4 nm) corresponding to an arc-shaped field in the projection optical system 130 to illuminate the reticle 120, and includes an EUV light source 112 and an illumination optical system 114.

The EUV light source 112 uses, for example, a laser plasma light source. The laser plasma light source irradiates a highly intensified pulse laser beam to a target material put in a vacuum, thus generating high-temperature plasma for use as EUV light with a wavelength of about 13 nm emitted from this. The target material may use a metallic thin film, inert gas, and droplets, etc. The pulse laser preferably has a high repetitive frequency, e.g., usually several kHz, for increased average intensity of the emitted EUV light.

The illumination optical system 114 is an optical system for introducing the EUV light from the EUV light source 112 to the reticle 120, and includes plural multilayer coating mirrors or oblique incident (condenser) mirrors 114a and an optical integrator 114b, etc. The condenser optical system 114a serves to condense the EUV light that is radiated approximately isotropically from the laser plasma. The optical integrator 114b serves to uniformly illuminate the reticle 120 at a predetermined NA. The illumination optical system 114 further includes an aperture (or a field stop) 114c for restricting the illumination area to an arc shape.

The reticle 120 is a reflection type reticle, and forms a circuit pattern (or image) to be transferred. It is supported and driven by the reticle stage 125. The diffracted light emitted from the reticle 12 is projected onto the object 140 after being reflected by the projection optical system 130. The reticle 120 and object 140 are arranged to be optically conjugate with each other. Since the exposure apparatus 1 of this embodiment is a scanner, the reticle 120 and object 140 are scanned with a reduction speed ratio to transfer a pattern on the reticle 120, onto the object 140.

The reticle stage 125 supports the reticle 120 via a reticle chuck 125a and is connected to a moving mechanism (not shown). The moving mechanism (not shown) may include a linear motor, etc., and drives the reticle stage 125 in X-axis, Y-axis and Z-axis directions, and around these axes, and moves the reticle 120. The exposure apparatus 700 assigns the Y axis to a scanning direction on a surface of the reticle 120 or the object 140, the X axis perpendicular to the Y axis, and the Z axis perpendicular to the reticle 120 or the object 140 surface.

The projection optical system 130 uses plural mirrors 130a to project a reduced size of a pattern on the reticle 120 onto the object 140 on the image surface. The small number of mirrors 130a can improve the use efficiency of the EUV light, but makes the aberrational corrections difficult. Therefore, the number of mirrors is about four to six. For a wide exposure area with the small number of mirrors, the reticle 120 and object 140 are simultaneously scanned to transfer a wide area that is a fine arc-shaped area or a ring field apart from the optical axis by a predetermined distance. The projection optical system 130 has an NA of about 0.2 to 0.3 at the side of the object 140. The mirror 130a makes its substrate of a rigid and hard material with low coefficients of thermal expansion, such as low expansion coefficient glass or silicon carbide, shapes a predetermined (e.g., concave or convex spherical or aspherical) reflective surface through grounding and polishing, and then forms a multilayer film, such as molybdenum/silicon, on the reflective surface. When the EUV light does not have constant incident angles upon the mirror 130a, a multilayer film with a constant film cycle enhances the reflectance depending upon a location and offsets the wavelength of the EUV light. Accordingly, a film cycle distribution is arranged so that the EUV light with the same wavelength may be reflected efficiently on a mirror surface.

The object 140 is a wafer in this embodiment, but broadly covers a liquid crystal substrate and other objects to be exposed. A photoresist is applied to the object 140.

An object to be exposed 140 is held onto the wafer stage 145 by the wafer chuck 145a. Similar to the reticle stage 125, the wafer stage 145 moves the object 140, for example, using a linear stage in XYZ-axes directions and rotational directions around respective axes. The positions of the reticle stage 125 and wafer stage 145 are monitored, for example, by a laser interferometer, and driven at a constant speed ratio.

The focus position detecting mechanism 150 always maintains a surface of the object 140 at the imaging position of the projection optical system 130 during exposure by measuring a position in the optical-axis direction and inclination of the object 140, and by controlling the position and angle of the wafer stage 145.

The position detector 200 detects a relative positional relationship between the reticle 120 and the object 140 directly or indirectly.

Figure 2:
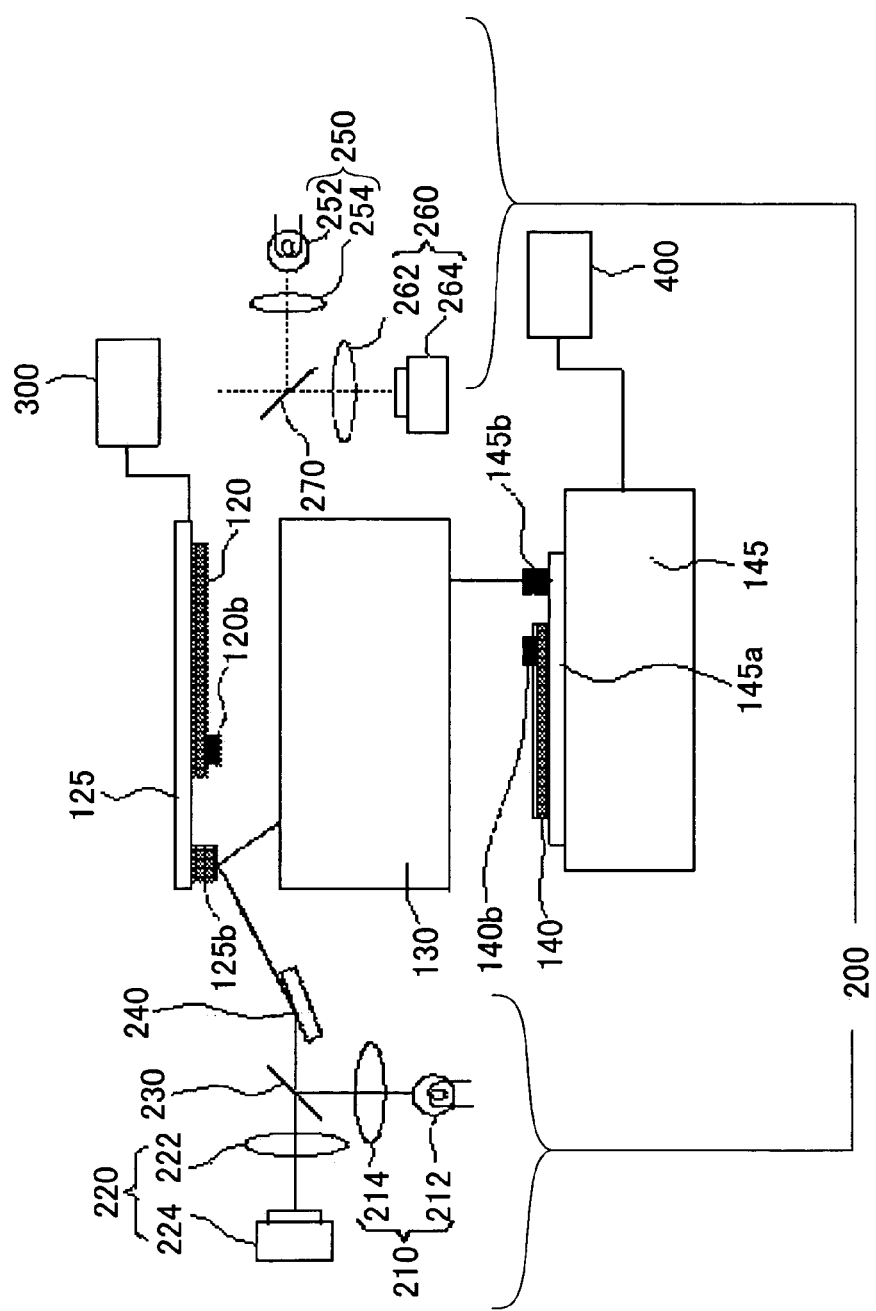
FIG. 2 is an enlarged block diagram showing one example of a structure of a position detector shown in FIG. 1.

A more specific description will now be given of the position detector 200. FIG. 2 is an enlarged block diagram showing one example of a structure of the position detector 200 shown in FIG. 1. The position detector 200 includes first and second position detecting means. The first position detecting means includes an illumination optical system 210 and a detection optical system 2200. The second position detecting means includes an illumination optical system 250 and a detection optical system 260.

The illumination optical system 210 includes a light source 212 for emitting non-exposure light, and a condenser lens 214. The illumination light from the illumination optical system 210 illuminates a reflection alignment mark (which is referred to as a "reticle stage reference mark" hereinafter) 125b on the reticle stage 125 after being reflected on the half mirror 230 and the mirror 240. The illumination light reflected on the reticle stage reference mark 125b passes the projection optical system 130, and illuminates the chuck mark 145b on the wafer chuck 145 for holding the wafer 140 as a substrate.

The detection optical system 220, which includes an imaging lens 222 and an image pickup device 224, detects images of the reticle stage reference mark 125b and the chuck mark 145b illuminated by the illumination optical system 210, and the marks 125b and 145b are aligned with each other through various image processing and detecting methods.

The illumination optical system 250 includes a light source 252 for emitting non-exposure light, and a condenser lens 254. The illumination light from the illumination optical system 210 illuminates the reflection alignment mark 125b on the reticle stage 125 after being reflected on half mirror 270. The image pickup device 264 receives the illumination light reflected on the reticle stage reference mark 125b via an imaging optical system 262.

A relative positional relationship between the reticle stage reference mark 125b and the reticle alignment mark 120b is previously detected using a method, which will be discussed later with reference to FIGS. 3 and 4. A relative positional relationship between the chuck mark 145b and the wafer alignment mark 140b is previously detected using a method, which will be discussed later with reference to FIGS. 5 and 6. Thus, the reticle 120 and the wafer 140 are aligned with each other by aligning the reticle stage reference mark 125b and the chuck mark 145b with each other.

Figure 3:
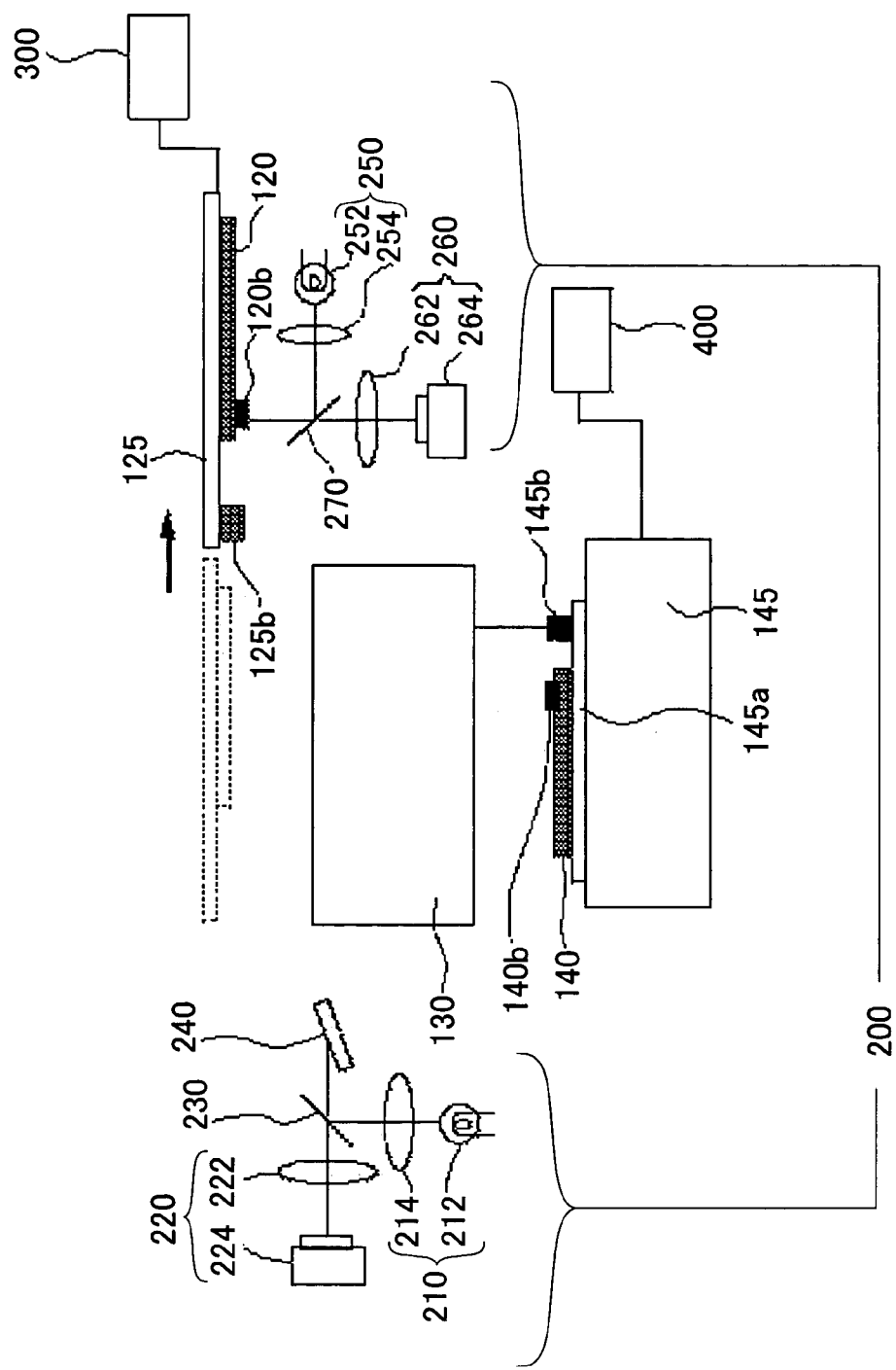
FIG. 3 is a view for explaining a measurement of a relative position between a reticle stage reference mark on a reticle stage and a reticle alignment mark on a reticle.
Figure 4:
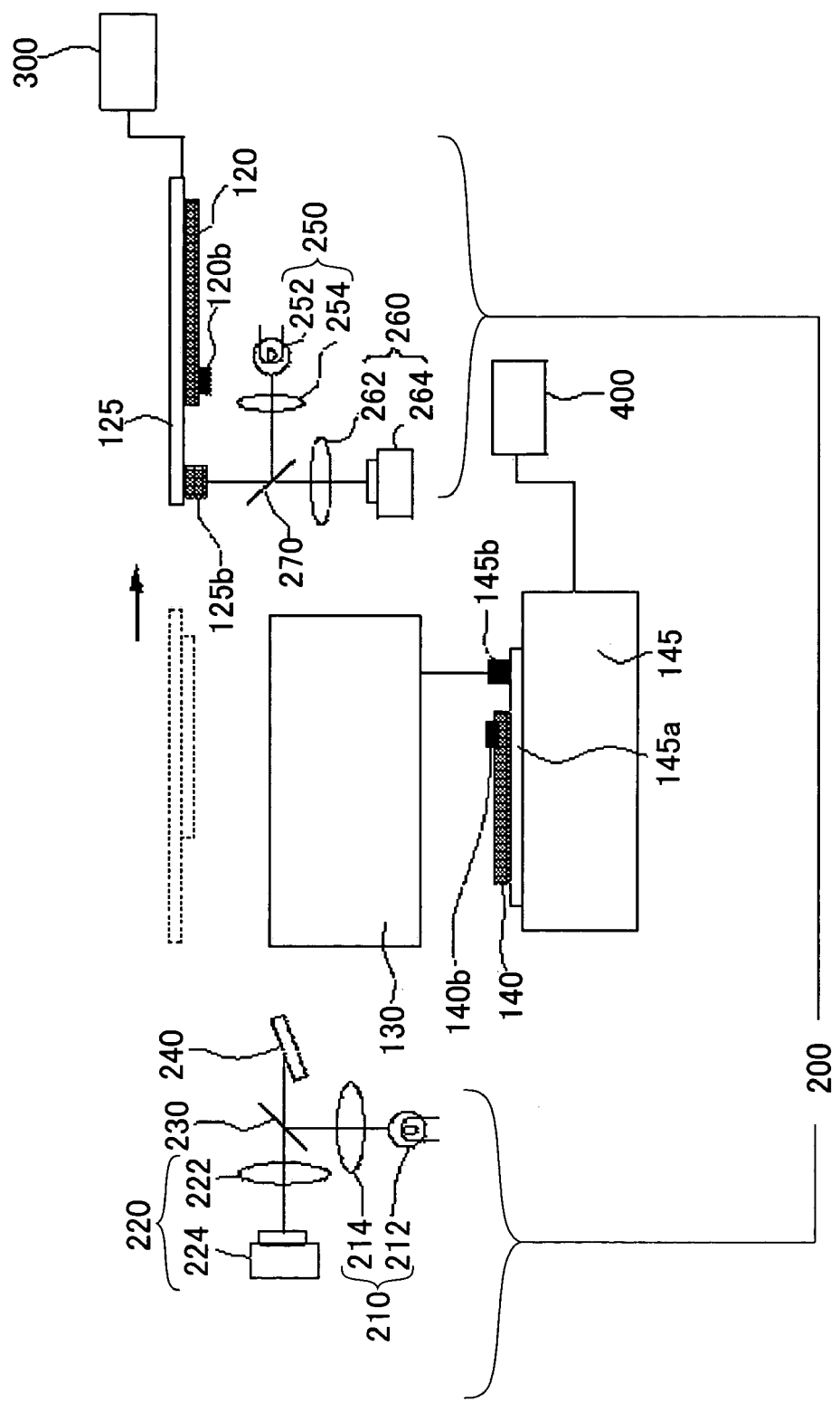
FIG. 4 is a view for explaining a measurement of the relative position between the reticle stage reference mark on the reticle stage and the reticle alignment mark on the reticle.

Referring now to FIGS. 3 and 4, a description will be given of a method of previously detecting the relative positional relationship between the reticle stage reference mark 125b and the reticle alignment mark 120b.

FIG. 3 is a view for explaining a measurement of a relative position between the reticle stage reference mark 125b on the reticle stage 125 and the reticle alignment mark 120b on the reticle 120, in particular, a detection of the reticle alignment mark 120b on the reticle 120. Referring to FIG. 3, in comparison with the state shown in FIG. 1, the reticle 120 and the reticle stage reference mark 125b move as the reticle stage 125 is driven in the arrow direction, and the image pickup device 264 in the detection optical system 260 receives an image of the reticle alignment mark 120b.

FIG. 4 is a view for explaining a measurement of a relative position between the reticle stage reference mark 125b on the reticle stage 125 and the reticle alignment mark 120b on the reticle 120, in particular, a detection of the reticle stage reference mark 125b on the reticle stage 125. In comparison with the state shown in FIGS. 2 and 3, the reticle 120 and the reticle stage reference mark 125b further move as the reticle stage 125 is further driven in the arrow direction, and the image pickup device 264 in the detection optical system 260 receives an image of the reticle stage reference mark 125b.

The reticle stage 125 initially moves to a detecting position of the detection optical system 260, as shown in FIG. 3. After the reticle stage 125 moves, the detection optical system 260 detects a position of the reticle alignment mark 120b on the reticle 120 through image processing, and a position of the reticle stage 125 at that time is stored in the reticle stage position storage 300. An interferometer mirror (not shown) provided to the reticle stage 125 and a laser interferometer (not shown) provided outside measure the position of the reticle stage 125 at that time.

Then, as the reticle stage 125 moves as shown in FIG. 4, the detection optical system 260 detects the position of the reticle stage reference mark 125*b* at that time, and the laser interferometer (not shown) measures the position of the reticle stage 125 at that time. The position of the reticle stage 125 is stored in the reticle stage storage 300. A relative positional relationship between the reticle stage reference mark 125*b* and the reticle alignment mark 120*b* is detected based on the coordinate of the reticle stage 125 at the time of detections of each mark by the detection optical system 260.

The detection optical system 260, the light source 252, illumination optical system 254, and the half mirror 270 may include a moving mechanism. In detecting the relative positional relationship between the reticle stage reference mark 125*b* and the reticle alignment mark 120*b*, a height between these two marks may be detected, for example, by detecting the defocus characteristic of the obtained image.

Figure 5:
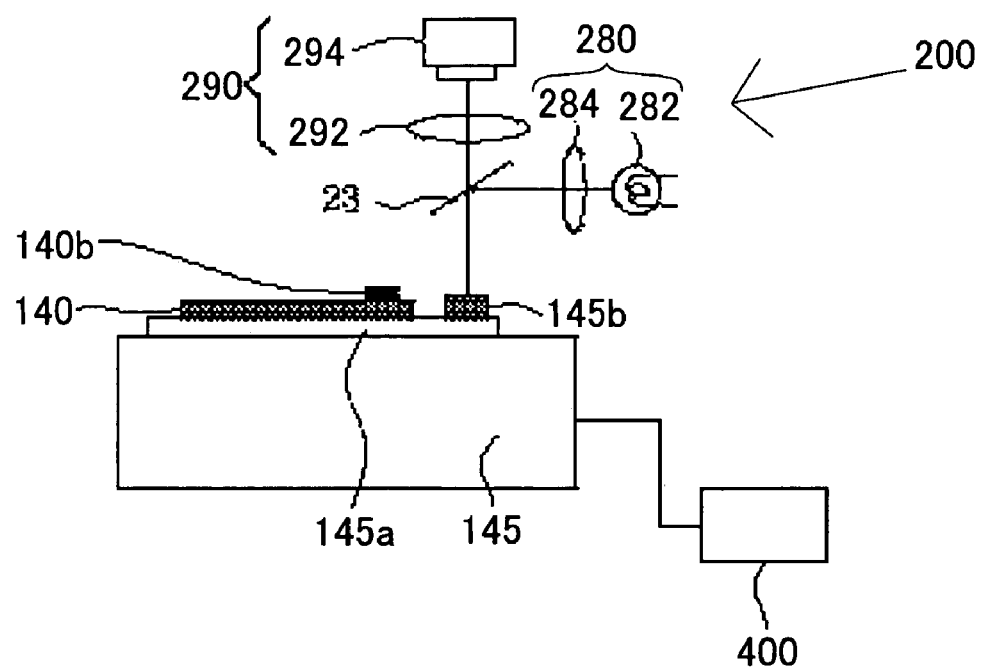
FIG. 5 is a view for explaining a detection of a relative positional relationship between a chuck mark of a chuck placed on a wafer stage and a wafer alignment mark on a wafer.
Figure 6:
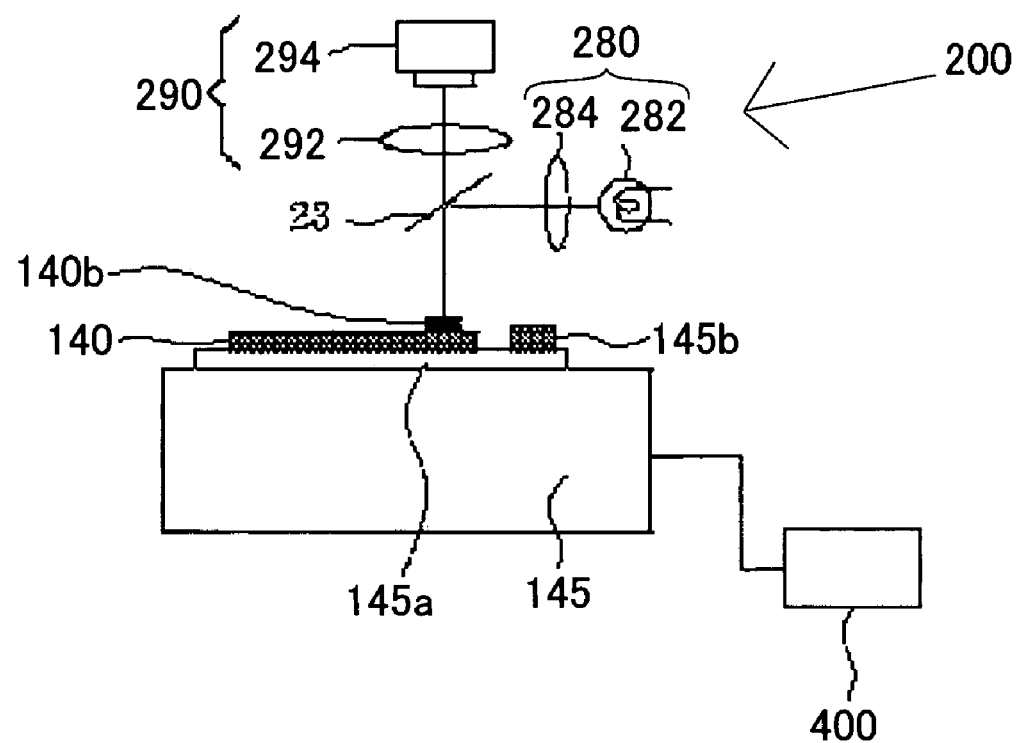
FIG. 6 is a view for explaining a detection of the relative positional relationship between the chuck mark of the chuck placed on the wafer stage and the wafer alignment mark on the wafer.

Referring now to FIGS. 5 and 6, a description will be given of a method for previously detecting the relative positional relationship between the chuck mark 145*b* and the wafer alignment mark 140*b*. This method includes the steps of detecting the relative positional relationship between them before the wafer 140 is mounted on the wafer stage 145 for exposure by the exposure apparatus 1, feeding the chuck 145*a* and the wafer 140 to mount them on the wafer stage 145 for exposure by the exposure apparatus 1 while the chuck 145*a* having the chuck mark 145*b* and the wafer 140 are held, detecting a relative positional relationship between the reticle stage reference mark 120*b* on the reticle 120 and the chuck mark 145*b*, and driving the wafer stage 145 for exposure based on information of the previously detected relative positional relationship between the chuck mark 145*b* and the wafer alignment mark 140*b*.

This configuration achieves parallel processing of the alignment measurement and the exposure, releases the structural constraint of the alignment optical system caused by the projection optical system in most cases, and provides various alignment optical systems for various wafer processes with a stable detection ratio, high precision, and high throughput.

The exposure apparatus 1 has no base line at the chuck mark side for the detection system (first position detecting means in this embodiment) for measuring a relationship between the reticle stage reference mark 125*b* on the reticle 120 and the chuck mark 145*b*, reducing the inferior factors for the measurement precision.

FIGS. 5 and 6 show that a third position detecting means, for detecting a relative positional relationship between the chuck mark 145*b* on the chuck 145*a* placed on the wafer stage 145 and the wafer alignment mark 140*b* on the wafer 140, detects each mark.

The third position detecting means of this embodiment includes an illumination optical system 280 that includes a light source 282 and a condenser lens 284, and a detection optical system 290 that includes an imaging optical system 292 and an image pickup device 294. The third position detecting means executes image processing, and detects the relative positional relationship between the chuck mark 145*b* and the wafer alignment mark 140*b*.

First, the wafer stage 145 moves to a detecting position of the detection optical system 290, as shown in FIG. 5. The detection optical system 290 detects a position of the chuck mark 145 at that time, which is stored in the wafer stage position storage 400.

Then, as the wafer stage 145 moves, as shown in FIG. 6, the detection optical system 290 detects the position of the wafer alignment mark 140*b* on the wafer 140 for plural shots through image processing, and a position of the reticle stage 145 at that time is stored in the wafer stage position storage 400. A relative positional relationship between the chuck mark 145*b* and the wafer alignment mark 140*b* is detected based on the positional coordinate of the wafer stage 145 at the time of detections of each mark by the detection optical system 290.

Thereby, the chuck mark 145*b* can serve as the alignment mark 140*b* at the wafer 140 side in detecting a relative position between the reticle 120 and the wafer 140. It is advantageous that the chuck mark 145*b* is located at an arbitrary position on the chuck 145*a*, and uses a substrate that exhibits high reflectance to the alignment light, improving the degree of freedom of design.

In detecting the relative positional relationship between the chuck mark 145*b* and the wafer alignment mark 140*b*, a height between these two marks may be detected, for example, by detecting the defocus characteristic of the obtained image.

Figure 7:
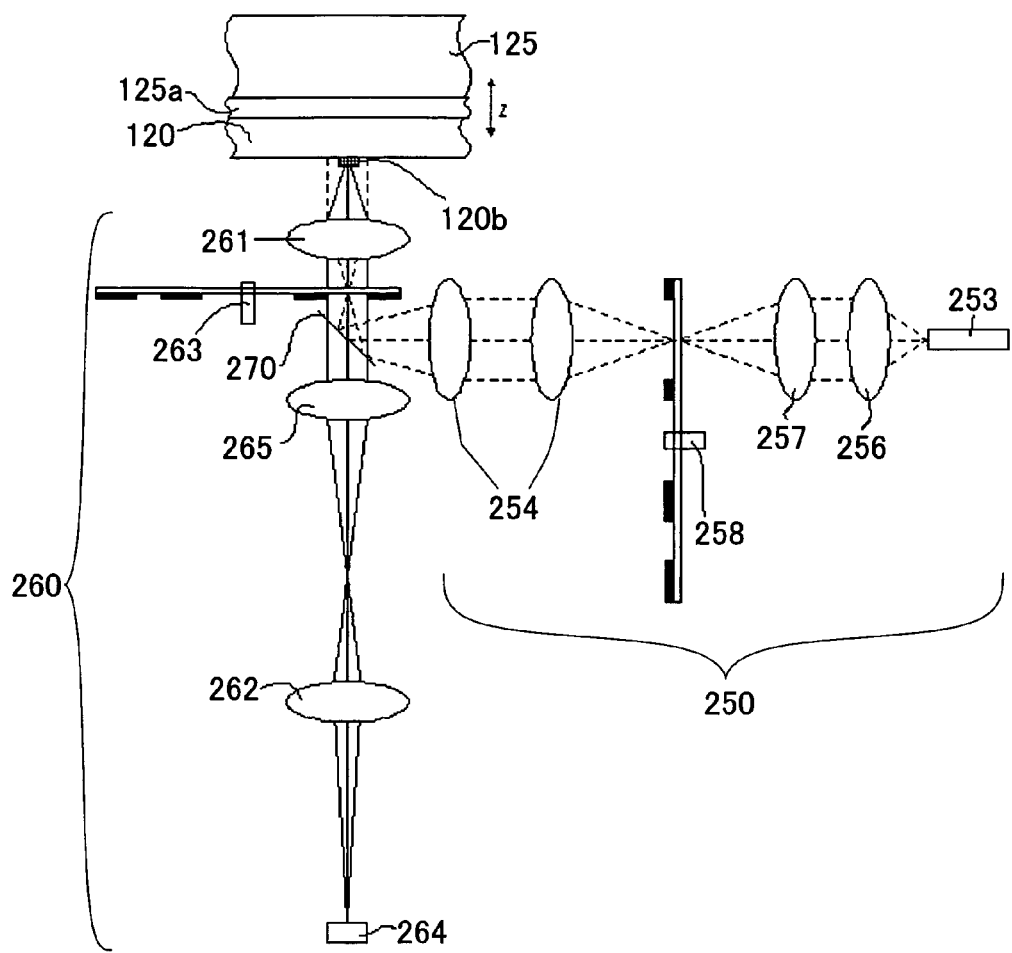
FIG. 7 is a block diagram of a detailed structure of a detection optical system in FIGS. 2 to 4.

A detailed description will now be given of the detection optical system 260 for detecting a position of the reticle stage reference mark 125*b* and the reticle alignment mark 120*b*. FIG. 7 is a block diagram of a detailed structure of the detection optical system 260 shown in FIGS. 2 to 4.

Referring to FIG. 7, the reticle 120 absorbed by the reticle chuck 125*a* on the reticle stage 125 has an uneven thickness distribution, and the reticle stage 120 can be driven in the Z direction so that the position in the focus direction can be corrected. The reticle chuck 125*a* absorbs the reticle 120, for example, in an electrostatic manner.

The light emitted from the light source 252 of the illumination optical system 250 is introduced into the condenser lenses 256 and 257. An aperture switch 258 having various shapes is located on a surface conjugate with the edge surface of the fiber 253, and the shape is selectable under the following condition.

Figure 8:
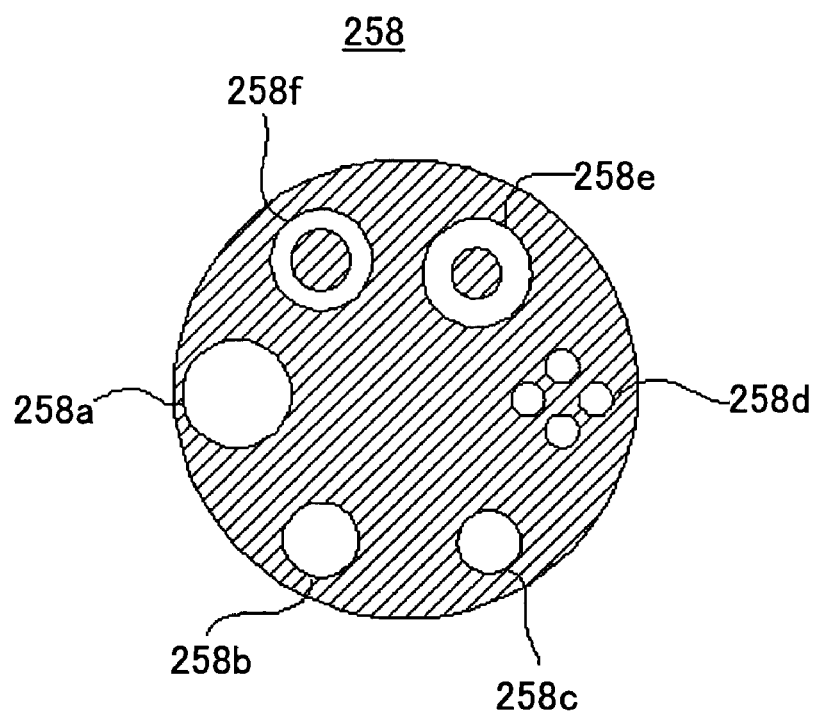
FIG. 8 is a plan view of an apparatus switch in FIG. 7.

The aperture switch 258 has plural openings 258*a* to 258*f* of various shapes, as shown in FIG. 8. Here, FIG. 8 is a plan view showing the aperture switch 258 shown in FIG. 7. This embodiment has six types of openings 258*a* to 258*f*, and the opening 258*a* is the maximum opening having the maximum NA of the detection optical system 260 or a so-called illumination σ value of 1. The openings 258*b* and 258*c* are smaller openings than the maximum opening. The opening 258*d* is used for dark field illumination or quadrupole illumination. The openings 258*e* and 258*f* are used for dark field illumination, as described later. In other words, the aperture switch 258 makes variable the illumination condition of the illumination optical system. Of course, the opening shape and number of the openings 258*a* to 258*f* in the aperture switch 258 are not limited to those of the above embodiment.

After one of the openings 258*a* to 258*f* is selected in the aperture switch 258, the light that passes through one of the openings 258*a* to 258*f* images on a pupil surface of the objective lens 251 in the detection optical system 250, which corresponds to a Fourier transformation surface of an observed object, via the condenser lens 254 and the half mirror 270 that synthesizes the illumination optical system 250 and the detection optical system 260. In other words, the exit edge surface of fiber 253, aperture switch 258 and the pupil surface of objective lens 261 are arranged in a conjugate relationship.

An NA switching mechanism 263 is provided on the pupil surface of objective lens 261 so as to vary the NA of the objective lens 261 on the observed object. The NA switching mechanism 263 forms an aperture having plural openings and makes the NA variable by selecting one of the openings.

The light that passes the NA switching mechanism 263 illuminates the reticle alignment mark 120b via the objective lens 261. In other words, the light that passes the edge surface of fiber 253, the aperture switch 258, and the NA switching mechanism 263 Koehler-illuminates the reticle alignment mark 120b.

The reflected light, diffracted light and scattered light generated from the reticle alignment mark 120b reaches the relay lens 265 after passing the objective lens 261 and the NA switching mechanism 263 again. The relay lens 265 forms an image of the reticle alignment mark 120b backward once.

Then, the imaging optical system 262 forms an image of the reticle alignment mark 120b on the image pickup device 264 again. A position of the reticle alignment mark 120b is calculated based on an electrical signal from the image pickup device 264. While this embodiment forms an image of the reticle alignment mark 120b on the image pickup device 264 via the objective lines 261, the relay lens 265 and the imaging optical system 262, these optical elements and the number of image formations are not limited to this embodiment, as long as the image of the reticle alignment mark 120b can be formed on the image pickup device 264.

Figure 9:
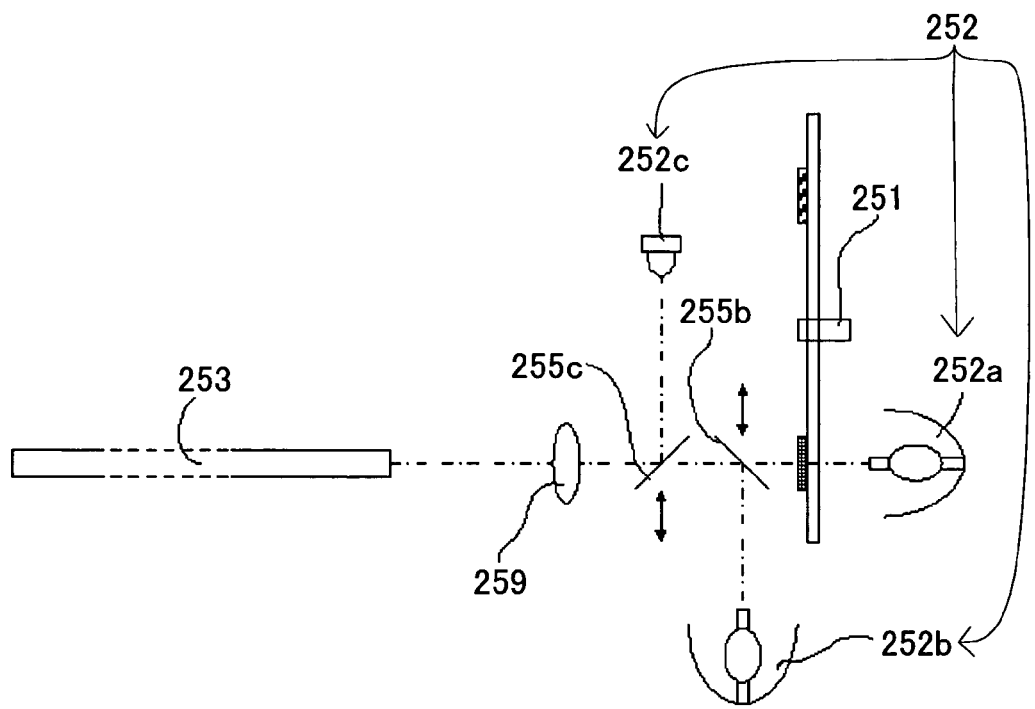
FIG. 9 is a block diagram of a structure at the incident side of a fiber shown in FIG. 7.

FIG. 9 shows a structure of a fiber 310 at its incident side. Referring to FIG. 9, three types of light sources 252 and a multistage wavelength filter 251 are provided at the incident side of the fiber 310. The light source 252a has a wavelength in an approximately visible light wave range, such as a halogen lamp, and it is the halogen lamp in this embodiment. The light emitted from the halogen lamp 252a has a wide band wave range that covers the visible light wave range, and passes the multistage wavelength filter 251.

Figure 10:
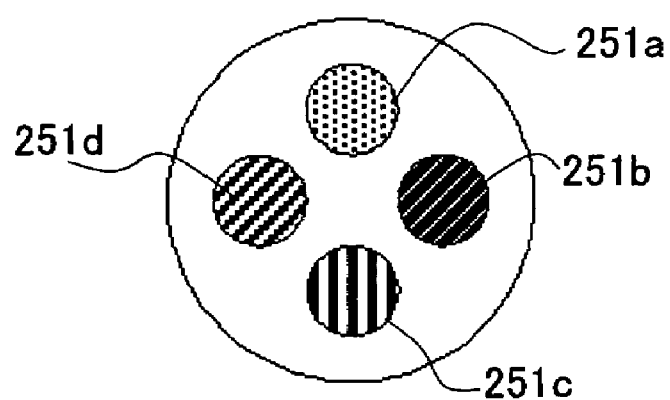
FIG. 10 is a plan view of a multistage wavelength filter shown in FIG. 9.

The multistage wavelength filter 251 arranges plural (or four in this embodiment) wavelength cut filters 251a to 251d on a turret as shown in FIG. 10, and selects a specific wavelength when rotating. The light is selectable in the wave range approximately between 400 nm and 750 nm. FIG. 10 is a plan view of the multistage wavelength filter 251 shown in FIG. 9.

The light that passes through the multistage wavelength filter 251 is efficiently introduced into the incident surface of the fiber 253 via the condenser lens 259, by moving the switching mirrors 255b and 255c away from the optical path. These mirrors can be arranged along and removed from the optical path.

The light source 252 further includes a light source 252b, such as a mercury lamp, for generating the UV light, and a light source 252c, such as an LED, for generating the infrared light. The light emitted from each of these light sources 252b and 252c can be introduced into the incident surface of the fiber 253, similar to the halogen lamp 252a, by inserting the switching mirrors 255b and 255c into the optical path.

The light having a desired wavelength can be introduced into the fiber 253 by selecting the switch mirror 255b or 255c, and the wavelength cut filters 251a to 251d in the multistage wavelength filter 251, and the fiber 253 introduces the light to the detection optical system 260. The type of the light source 252 exemplarily covers, but is not limited to, the above halogen lamp, mercury lamp and LED. For example, another light source, such as an LD and a He—Ne laser, can be employed instead of the LED. Since the fiber 253 needs to transmit the UV light, it should be a UV transmitting fiber.

As discussed above, the light introduced to the detection optical system 260 enables the reticle alignment mark 120b to be observed under the condition in the wave range. These light source units are located outside the vacuum region, and the light is introduced into the detection optical system 260 through a deflection system using the fiber 253, the optical lens, etc. This configuration can prevent degas and heat from the lamp, etc., from contaminating the vacuum environment.

It is preferable to correct the chromatic and other aberrations of the detection optical system 260 as completely as possible in the wide wave range. However, it can be difficult to actually correct the aberrations in the entire wave range due to the limited glass material for the lens, etc., applicable to the UV light. In this case, the following method can eliminate the influence of the aberrations.

The detection optical system 260 that detects the reticle alignment mark 120b in the instant embodiment makes variable the optical parameters, such as various illumination conditions, including the NA of the illumination optical system 250 by using the aperture switch 258, the NA of the detection optical system 260 using the NA switching mechanism 263, and the observation wavelength. A description will be given of a selection of this optical parameter.

Figure 11A:
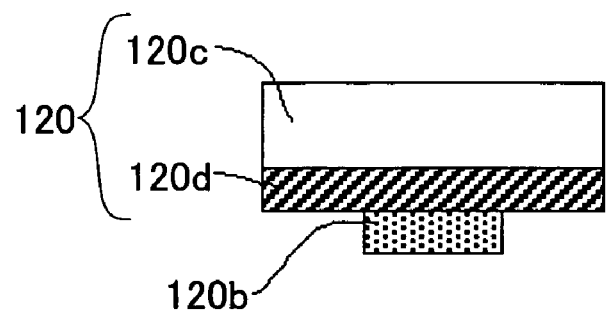
FIGS. 11A to 11D are views showing relationships between a structure of a reticle alignment mark on the reticle and alignment signals.
Figure 11B:
Figure 11C:
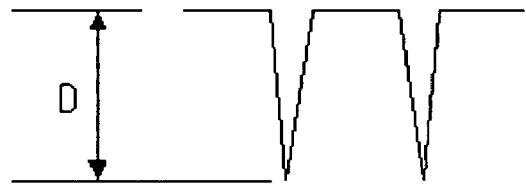
Figure 11D:
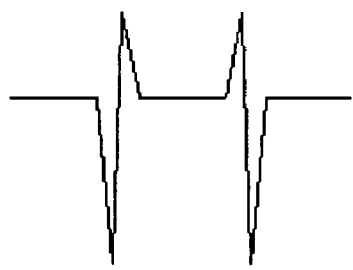

FIG. 11A graphically shows a sectional shape of the reticle alignment mark 120b of the reticle 120 having a certain layered structure. FIGS. 11B to 11D illustrate obtained mark signals as a result of the detection of the reticle alignment mark 120b by the detection optical system 260.

The reticle 120 has a reflection coating 120d made of a multilayer structure of molybdenum and silicon on the substrate 120c so as to efficiently reflect the EUV light. On the other hand, an antireflection coating is formed on the reflection coating 120d and has a layered structure that does not reflect the EUV light. The reticle alignment mark 120b is made of the antireflection coating. Since the reflection coating 120d is basically made of a metal film, the light is reflected to some extent in the wave range used for the detection optical system 260.

FIG. 11A assumes that the antireflection coating has a similar reflectance as that of the reflection coating 120d. As discussed above, when the detection optical system 260 uses a wide wave range for observations, the detection optical system 260 has such a reduced NA enough to resolve the reticle alignment mark 120b so as to restrain generations of aberrations, such as spherical aberration and coma, which depend upon the NA. However, when the reticle alignment mark 120b as an antireflection coating has a low step, the reduced NA might make the mark 120b undetectable as an alignment signal having high contrast. The alignment signal of low contrast may deteriorate the measurement precision or make the mark undetectable in an ultimate case. Therefore, the alignment signal needs a relatively high contrast.

FIG. 11B shows the alignment signal of the low contrast, which does not provide a signal depth D sufficiently. In order to improve the contrast for this alignment signal, it is effective to increase the NA of the detection optical system 260 or to shorten the wavelength of the alignment light.

FIG. 11C shows an alignment signal of the reticle alignment mark 120b that is detected when the alignment light has an increased NA or a shortened wavelength. Referring to FIG. 11C, the alignment signal has the improved contrast, and it can guarantee the detection precision of the reticle alignment mark 120b. Even if the above measures are ineffective to improve the contrast for the alignment signal, the contrast can be highlighted sufficiently by reducing the a value of the illumination optical system 250 (=NA of the illumination optical system/NA of the detection optical system). An excessively small a value is undesirable, because the illumination with the small a value enhances the influence of aberrations in the detection optical system 260 and causes asymmetrical distortions in the alignment signal. The reduced a value is, therefore, used when the exposure apparatus 1 cannot detect the reticle alignment mark 120b. This is true of the NA.

Figure 12A:
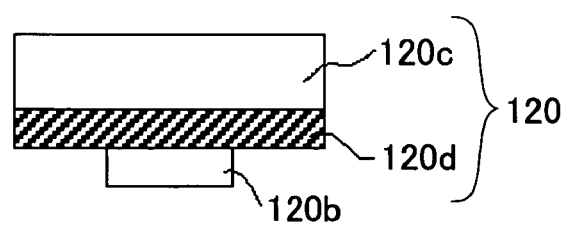
FIGS. 12A to 12C are views showing relationships between the structure of the reticle alignment mark on the reticle and alignment signals.
Figure 12B:
Figure 12C:

FIG. 12A shows that the alignment light can transmit the reticle alignment mark 120b as the antireflection coating. It is then conceivable that multiple interferences occur in the reticle alignment mark 120b and preclude an acquisition of the sufficient contrast to a specific wavelength. FIG. 12B shows an alignment signal that has a bad interference condition to a certain specific wavelength. For example, the wavelength is preferably as high as possible from the viewpoint of the aberrational sensitivity. If the interference condition is bad for the infrared light, as shown in FIG. 12B, a change of the wavelength to the visible light or the UV light varies the interference state on the reticle alignment mark 120b as the antireflection coating, and can improve the alignment signal having high contrast, as shown in FIG. 12C.

An optical wavelength is selected by evaluating the contrast in the alignment signal, because which wavelength is the most suitable wavelength depends upon the structure of the reticle alignment mark 120b that serves as the antireflection coating. The optical parameters, such as wavelength, NA and a value, are selected, for example, by evaluating a value of the signal depth D shown in FIG. 11C and by determining whether the predetermined contrast is obtained. Of course, the contrast can be defined by another function, as long as the optical parameter that satisfies a predetermined evaluation value is selected.

While the instant embodiment discusses simultaneous changes of all of the NA's of the detection optical system 260, the wavelength, and the a value of the illumination optical system 250, one or more of them can be changed for practical use.

A description will now be given of the dark field detection using the opening 258e or 258f in the aperture switch 258 shown in FIG. 8. While FIG. 7 shows a structure that makes the NA variable on the pupil surface of the objective lens 261, the NA switching mechanism 263 is not limited to this position. In particular, it may be located near the pupil of the imaging optical system behind the objective lens 261 for the dark field detection. The diffracted light from the reticle alignment mark 120b can be detected as the dark field detection in the epi-illumination optical system by positioning the NA switching mechanism 263 on the pupil surface through which only the detection light passes, and by making the opening shape smaller than the inner circle's diameter of the opening 258f. This dark field detection can be effective if the alignment signal having a high contrast is not available as described with reference to FIGS. 11A to 12C. Apparently, a combination of the dark field detection and a wavelength change is effective.

The instant embodiment can flexibly handle pattern changes by using the detection optical system 260 that makes the optical parameter variable, if the coating structure in the reticle alignment mark 120b otherwise cannot always provide the detection optical system having fixed optical parameters with an alignment signal having high contrast, although the mark 120b guarantees predetermined characteristics to the EUV light.

A description will now be given of the measurement of the residue aberration for the alignment light used for the detection light. The detection optical system 260 can include the on-axis chromatic aberration for certain wavelengths. After a certain wavelength is selected, the alignment mark 120b on the reticle 120 is observed. The on-axis chromatic aberration defocuses the alignment signal. Accordingly, the reticle 120 is moved in the focus direction and the contrast of the alignment signal is calculated using the detection optical system 260 at each focus position. The image defocus due to the on-axis chromatic aberration is eliminated to some extent by calculating the focus position that maximizes the contrast and by detecting the reticle alignment mark 120b at that position.

The reticle stage reference mark 125b is measured for the thus calculated focus position as discussed above. Then, for example, the TTL alignment optical system calculates a relative position with the wafer. As a consequence, a lateral offset component that is generated from an inclination of the principal optical axis of the detection optical system can be compensated.

The magnification chromatic aberration is detectable even when the size of the mark slightly varies by calculatedly correcting a magnification error that occurs in a specific wavelength. An offset amount caused by the magnification chromatic error can be effectively reduced when the alignment mark 120b is always detected with respect to the center of the detection optical system 260. Similar to the above off-axis chromatic aberration, a measurement of a position of the reticle stage reference mark 125b can more effectively reduce the possible error amount.

While the above embodiment resumes the measurement of the position of the reticle reference mark 125b whenever the wavelength is changed, each measurement is omitted by measuring, storing in the apparatus, and using offsets that depend upon the NA of the predetermined wavelength, a σ value of the illumination optical system 250, and an NA of the detection optical system 260. The reticle stage reference mark 125b is formed by a metal coating, such as CR, on a glass substrate, and enables the detection optical system 260 to detect an alignment signal having a high contrast in the wave range used for the detection optical system 260.

The position detector 200 can always detect the reticle alignment mark at a high contrast (or a high signal-to-noise ratio) and provide highly precise positioning, for example, at the time of the alignment between the reticle (original form) and the wafer (substrate) in the EUV exposure apparatus, etc., by making variable some optical parameters, such as the NA of the detection optical system for detecting the reticle alignment mark, the NA of the illumination optical system (or illumination σ value), a wavelength, a bright field detection, and a dark field detection, for various reticle alignment marks that have multilayer coatings optimized to the EUV light on the reticle. In other words, the position detector 200 can vary the contrast of the detected alignment signal by varying the detecting condition.

In exposure, the EUV light emitted from the illumination apparatus 110 illuminates the reticle 120, and a pattern on the reticle 120 is imaged on the object 140 via the projection optical system 130. The instant embodiment uses the arc- or ring-shaped image surface to expose the entire surface of the reticle 120 by scanning the reticle 120 and the object 140 at a speed ratio corresponding to the reduction ratio. Since the exposure apparatus 1 provides devices, a semiconductor device, an LCD device, an image pickup device (such as a CCD), and a thin film magnetic head may be manufactured, because the position detector 200 provides a highly precise alignment.

Figure 13:
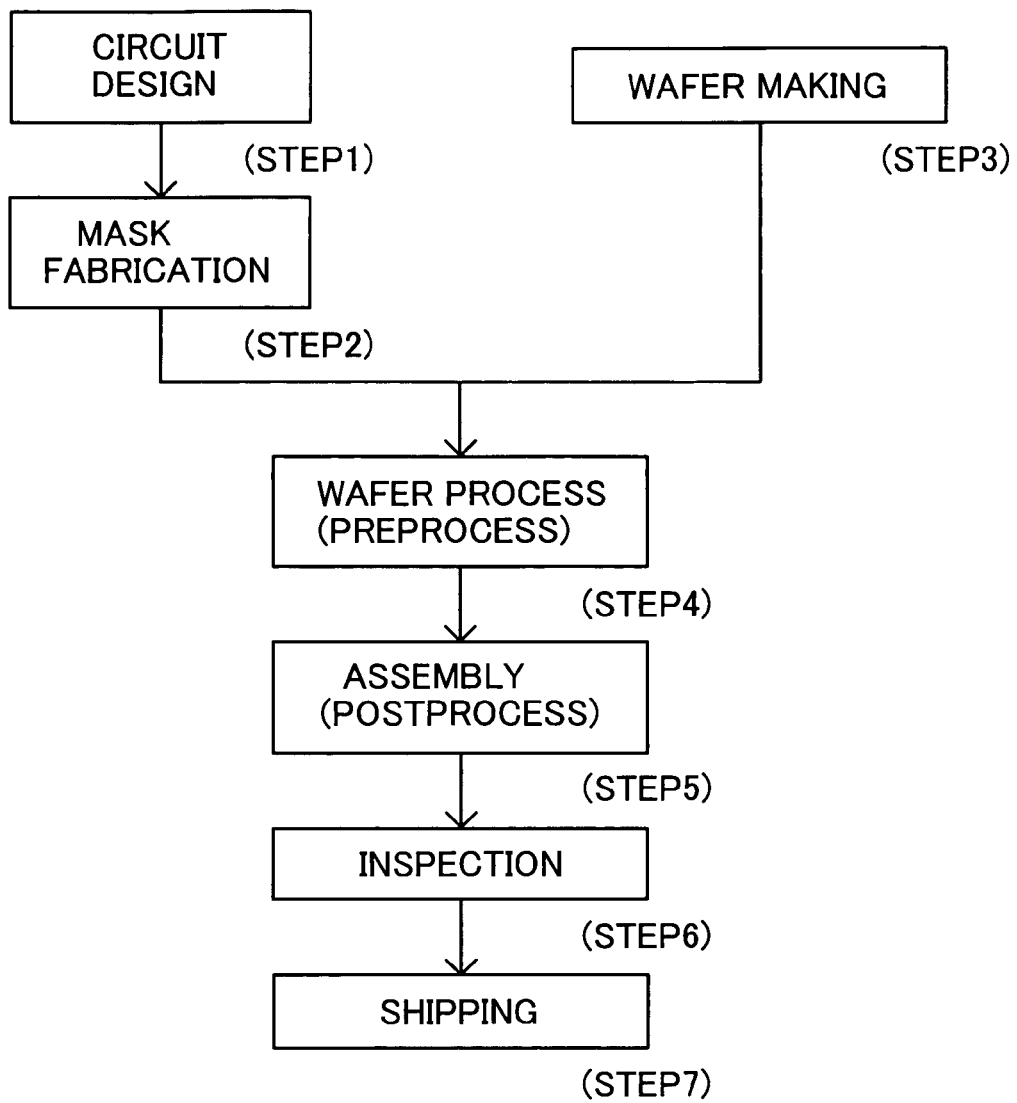
FIG. 13 is a flowchart for explaining a method of fabricating devices (e.g., semiconductor chips such as ICs, LSIs, and the like, LCDs, CCDs, etc.).
Figure 14:
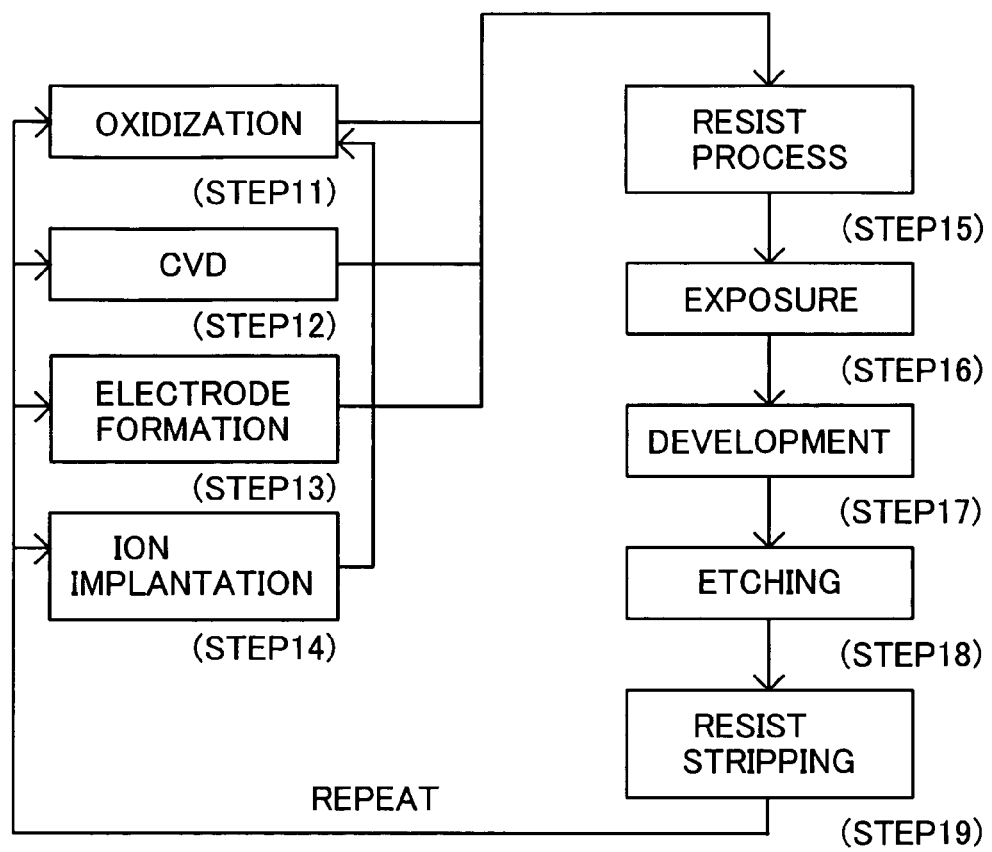
FIG. 14 is a detailed flowchart of Step 4 of the wafer process shown in FIG. 13.

Referring to FIGS. 13 and 14, a description will now be given of an embodiment of a device fabricating method using the above-mentioned exposure apparatus 1. FIG. 13 is a flowchart for explaining fabrication of devices (i.e., semiconductor chips such as ICs and LSIs, LCDs, CCDs, etc.). Here, a description will be given of fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor devices made in Step 5, such as a validity test and a durability test. Through these steps, a semiconductor device is finished and shipped (Step 7).

FIG. 14 is a detailed flowchart of the wafer process in Step 4 shown in FIG. 5. Step 11 (oxidation) oxidizes the wafer's surface. Step 12 (CVD) forms an insulating film on the wafer's surface. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 18 (etching) etches parts other than a developed resist image. Step 19 (resist stripping) removes unused resist after etching. These steps are repeated, and multilayer circuit patterns are formed on the wafer. The device fabrication method of this embodiment may manufacture higher quality devices than the conventional one. Thus, the device fabrication method using the exposure apparatus 1, and the devices as finished goods also constitute one aspect of the present invention.

Thus, the present invention can provide a position detector and a position detecting method suitable for highly precise detections of a position for a reflective optical element.

Further, the present invention is not limited to these preferred embodiments, and various variations and modifications may be made without departing from the spirit and scope of the present invention.

This application claims foreign priority benefits based on Japanese Patent Application No. 2003-401216, filed on Dec. 1, 2003, which is hereby incorporated by reference herein in its entirety as if fully set forth herein.

What is claimed is:

1. A position detector for detecting a relative positional relationship between an original form that has a position detecting mark, and a stage that supports the original form and has a reference mark, said position detector comprising:

an illumination optical system for illuminating the position detecting mark or the reference mark using illumination light;

a detection optical system for introducing reflection light that is reflected from the position detecting mark or the reference mark, to an image pickup unit; and a controller for varying at least one of a numerical aperture of the detection optical system, a numerical aperture of the illumination optical system and a wavelength of the illumination light to control contrast of a mark signal that is detected by the image pickup unit and indicates the position detecting mark or the reference mark, wherein said relative positional relationship is detected using offsets generated in a predetermined numerical aperture of the detection optical system, a predetermined numerical aperture of the illumination optical system and a predetermined wavelength of the illumination light measured beforehand.

2. A position detector according to claim 1, wherein said illumination optical system includes an aperture stop, and said controller varies a shape of the aperture stop in said illumination optical system.

3. A position detector according to claim 1, wherein the original form is a reflection original form.

4. An exposure apparatus comprising:

an illumination optical system for illuminating a pattern on an original form using exposure light;

a projection optical system for projecting the pattern onto an object; and a position detector, according to claim 1, for providing alignment of the original form.

5. An exposure apparatus according to claim 4, wherein the exposure light is extreme ultraviolet light having a wavelength between 10 nm and 15 nm.

6. An exposure apparatus according to claim 4, wherein the original form is a reflection original form.

7. An exposure apparatus according to claim 6, wherein the original form has a multilayer coating having optimized reflectance to the exposure light.

8. A device manufacturing method comprising the steps of:

exposing an object using an exposure apparatus; and developing the object exposed, wherein the exposure apparatus includes:

(i) an illumination optical system for illuminating a pattern on an original form using exposure light;

(ii) a projection optical system for projecting the pattern onto an object; and (iii) a position detector according to claim 1 for providing alignment of the original form.

9. A position detecting method for detecting a relative positional relationship between an original form that has a position detecting mark, and a stage that supports the original form and has a reference mark, said position detecting method comprising the steps of:

illuminating the position detecting mark or the reference mark using illumination light by an illumination optical system;

introducing reflection light that is reflected from the position detecting mark or the reference mark to an image pickup unit by a detection optical system;

detecting reflection light that is reflected from the position detecting mark or the reference mark using the image pickup unit;

determining whether the mark signal obtained from the reflection light detected in said detecting step has predetermined contrast;

changing at least one of a numerical aperture of the detection system, a numerical aperture of the illumination optical system and a wavelength of the illumination light when said determining step determines that the mark signal does not have the predetermined contrast; and detecting the relative positional relationship using offsets generated in a predetermined numerical aperture of the detection optical system, a predetermined numerical aperture of the illumination optical system and a predetermined wavelength of the illumination light measured beforehand.

* * * * *

UNITED STATES PATENT AND TRADEMARK OFFICE
CERTIFICATE OF CORRECTION

| | |
|---|---|
| PATENT NO. | : 7,142,284 B2 |
| APPLICATION NO. | : 10/998596 |
| DATED | : November 28, 2006 |
| INVENTOR(S) | : Kazuhiko Mishima |

Page 1 of 1

It is certified that error appears in the above-identified patent and that said Letters Patent is hereby corrected as shown below:

COLUMN 11:
    Line 6, "a value" should read -- $\sigma$ value --.
    Line 7, "a value" should read -- $\sigma$ value --.
    Line 10, "a value" should read -- $\sigma$ value --.
    Line 40, "a value" should read -- $\sigma$ value --.

Signed and Sealed this

Tenth Day of April, 2007

JON W. DUDAS
*Director of the United States Patent and Trademark Office*